(12) United States Patent
Tashiro (10) Patent No.: US 9,455,289 B2
(45) Date of Patent: Sep. 27, 2016

(54) SOLID-STATE IMAGE SENSOR AND CAMERA

(71) Applicant: CANON KABUSHIKI KAISHA, Tokyo (JP)

(72) Inventor: Kazuaki Tashiro, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/255,109

(22) Filed: Apr. 17, 2014

(65) Prior Publication Data

US 2014/0333814 A1    Nov. 13, 2014

(30) Foreign Application Priority Data

May 10, 2013    (JP) ................................. 2013-100707
Mar. 27, 2014    (JP) ................................. 2014-066811

(51) Int. Cl.
*H01L 27/146*    (2006.01)
*H04N 9/04*    (2006.01)

(52) U.S. Cl.
CPC ... *H01L 27/14621* (2013.01); *H01L 27/14609* (2013.01); *H01L 27/14643* (2013.01); *H04N 9/045* (2013.01)

(58) Field of Classification Search
CPC .................. H01L 27/14621; H01L 27/14643; H01L 27/14609; H01L 27/14612; H01L 27/14627; H04N 5/378; H04N 5/355; H04N 3/155; H04N 9/045
See application file for complete search history.

(56) References Cited

U.S. PATENT DOCUMENTS

| | | | |
|---|---|---|---|
| 5,159,422 A | 10/1992 | Tashiro et al. | |
| 5,366,921 A | 11/1994 | Tashiro | |
| 6,069,393 A | 5/2000 | Hatanaka et al. | |
| 6,717,151 B2 | 4/2004 | Tashiro et al. | |
| 6,800,836 B2 | 10/2004 | Hamamoto et al. | |
| 7,129,458 B2 | 10/2006 | Hamamoto et al. | |
| 8,344,306 B2 | 1/2013 | Kim | |
| 8,633,431 B2 | 1/2014 | Kim | |
| 8,982,261 B2 * | 3/2015 | Spears | G06F 3/042 250/208.1 |
| 2004/0174446 A1 * | 9/2004 | Acharya | H04N 5/33 348/279 |
| 2006/0177129 A1 * | 8/2006 | Matsuyama | H04N 5/332 382/167 |
| 2007/0146512 A1 * | 6/2007 | Suzuki | H04N 5/332 348/272 |
| 2007/0216785 A1 * | 9/2007 | Nomura | H04N 9/045 348/242 |
| 2009/0002531 A1 * | 1/2009 | Godaiin | H01L 27/14621 348/294 |
| 2010/0231774 A1 | 9/2010 | Tashiro | |
| 2013/0015326 A1 * | 1/2013 | Tamura | H01L 27/14612 250/208.1 |
| 2013/0208172 A1 | 8/2013 | Tashiro et al. | |

FOREIGN PATENT DOCUMENTS

JP    2010-035168 A    2/2010

* cited by examiner

*Primary Examiner* — Luong T Nguyen
(74) *Attorney, Agent, or Firm* — Fitzpatrick, Cella, Harper & Scinto (57) ABSTRACT

A solid-state image sensor includes a plurality of first pixels and a plurality of second pixels. Each of the plurality of first pixels includes a first filter having a visible light transmittance higher than an infrared light transmittance, and a first photoelectric converter configured to receive visible light transmitted through the first filter, and each of the plurality of second pixels includes a second filter having an infrared light transmittance higher than a visible light transmittance, and a second photoelectric converter configured to receive infrared light transmitted through the second filter. The plurality of second pixels are divided into a plurality of groups each includes at least two second pixels. The solid-state image sensor includes a synthesizer configured to synthesize a signal from signals of the at least two second pixels included in each group.

14 Claims, 9 Drawing Sheets

SOLID-STATE IMAGE SENSOR AND CAMERA

BACKGROUND OF THE INVENTION

1. Field of the Invention

The present invention relates to a solid-state image sensor and a camera.

2. Description of the Related Art

A living body has transmittance of infrared light having a wavelength of 800 to 1,000 nm. A technique of visualizing the interior of the body by injecting, into the body, a drug which is excited by infrared light to emit fluorescence in the infrared range, and detecting the fluorescence is attracting attention. A monochrome image sensor sensitive to the infrared range can capture fluorescence in the infrared range from the inside of the body. In addition, it is required to simultaneously output color information, and to monitor a visible light image and an infrared light image at the same time. A method of performing imaging using a visible light image sensor and an infrared light image sensor, and superimposing the thus obtained images on each other is plausible. However, it is difficult to reduce the size and cost. It is, therefore, required to obtain a visible light image and an infrared light image using a single image sensor.

Japanese Patent Laid-Open No. 2010-35168 discloses an imaging device which alternately outputs a color frame formed by red, green, and blue pixels and a depth frame obtained by detecting infrared rays in these pixels.

The imaging device described in Japanese Patent Laid-Open No. 2010-35168 can increase the sensitivity to infrared rays since it detects infrared rays in four pixels to obtain one signal. In the imaging device described in Japanese Patent Laid-Open No. 2010-35168, the four pixels are also pixels for obtaining red, green, and blue signals, and thus visible light noise is mixed into an infrared signal.

SUMMARY OF THE INVENTION

The present invention provides a technique advantageous in detecting infrared light at a high S/N ratio by a solid-state imaging sensor which can detect visible light and infrared light.

The present invention provides a solid-state image sensor including a plurality of first pixels and a plurality of second pixels, wherein each of the plurality of first pixels includes a first filter having a visible light transmittance higher than an infrared light transmittance, and a first photoelectric converter configured to receive visible light transmitted through the first filter, and each of the plurality of second pixels includes a second filter having an infrared light transmittance higher than a visible light transmittance, and a second photoelectric converter configured to receive infrared light transmitted through the second filter, the plurality of second pixels are divided into a plurality of groups each including at least two second pixels, and the solid-state image sensor includes a synthesizer configured to synthesize a signal from signals of the at least two second pixels included in each group.

Further features of the present invention will become apparent from the following description of exemplary embodiments with reference to the attached drawings.

DESCRIPTION OF THE EMBODIMENTS

Figure 1:
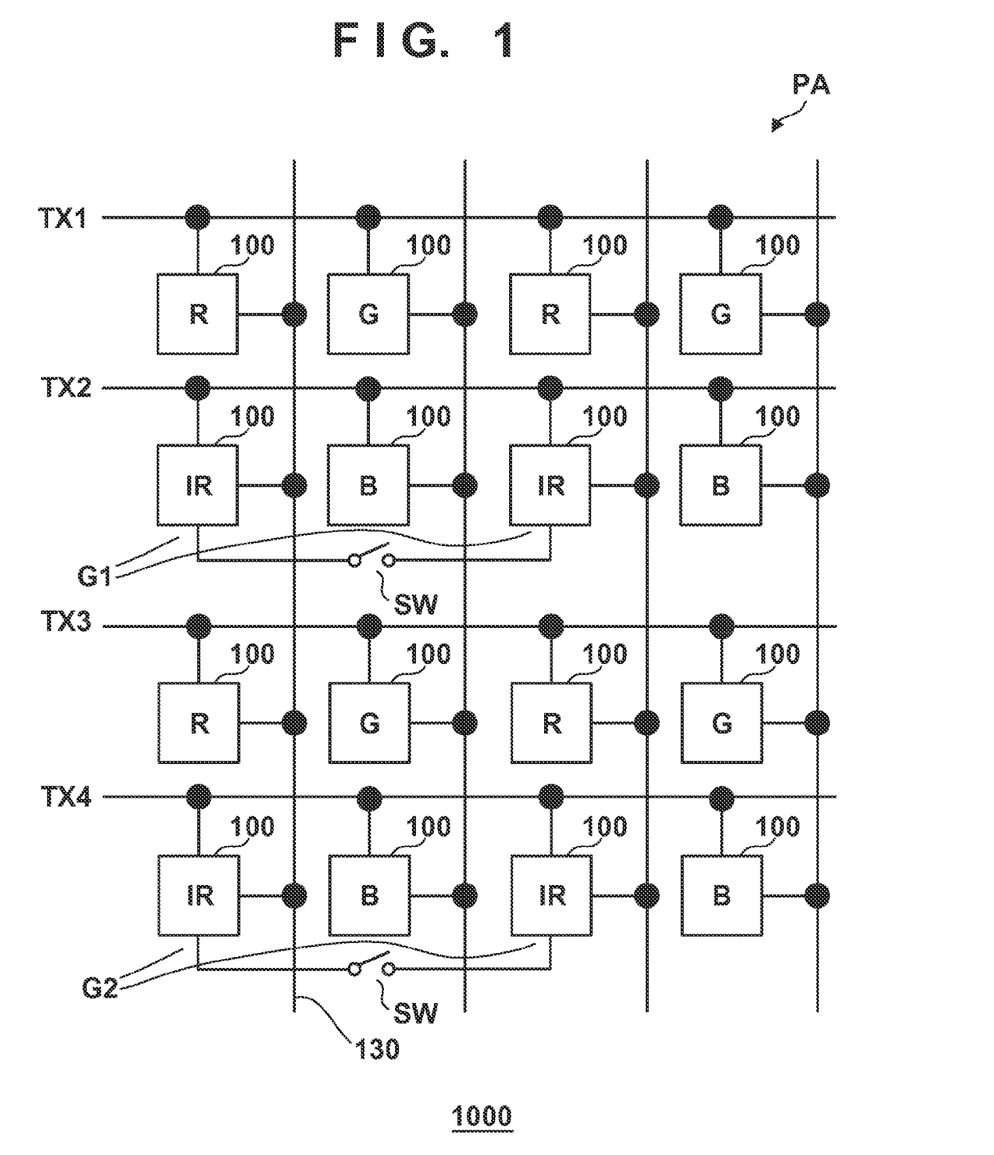
FIG. 1 is a view showing the arrangement of the pixel array of a solid-state image sensor according to the first embodiment of the present invention.

FIG. 1 shows the arrangement of a pixel array PA of a solid-state image sensor 1000 according to the first embodiment of the present invention. Note that FIG. 1 shows pixels 100 arrayed to form 4 rows×4 columns for the sake of simplicity. However, a larger number of pixels 100 are actually arrayed to form a larger number of rows and a larger number of columns. The plurality of pixels 100 of the pixel array PA include R, G, and B pixels as first pixels for detecting visible light, and IR pixels as second pixels for detecting infrared light.

The R, G, B, and IR pixels are respectively indicated by "R", "G", "B", and "IR" in FIG. 1 and other drawings. Each of the R, G, and B pixels as the first pixels includes a first filter for blocking infrared light and transmitting visible light, and a first photoelectric converter for detecting the visible light transmitted through the first filter. In another embodiment, the first filter may transmit part of infrared light. The transmittance of visible light entering the first filter need only be higher than that of infrared light entering the first filter. The transmittance is a ratio of the amount of light transmitted through a given filter to that of light entering the filter. Each IR pixel as the second pixel includes a second filter for blocking visible light and transmitting infrared light, and a second photoelectric converter for detecting the infrared light transmitted through the second filter. In another embodiment, the second filter may transmit part of visible light. The transmittance of infrared light entering the second filter need only be higher than that of visible light entering the second filter.

In this example, the R, G, and B pixels as the first pixels have different first filters. More specifically, the R pixel has a color filter for selectively transmitting red wavelength light as the first filter. The G pixel has a color filter for selectively transmitting green wavelength light as the first filter. The B pixel has a color filter for selectively transmitting blue wavelength light as the first filter. This arrangement makes it possible to reduce mixing of infrared light components into the signals of the R, G, and B pixels, and also reduce mixing of visible light components into the IR pixels.

In a smallest unit of a Bayer arrangement, that is, a unit of one R pixel, one B pixel, and two G pixels, for example, an IR pixel can be arranged instead of one of the G pixels. In this specification, the pixel array PA includes a row on which the first pixel and the second pixel are alternately arranged and a row on which only the first pixels are arranged. The plurality of IR pixels as the plurality of second pixels forming the pixel array PA are divided into a plurality of groups G1, G2, . . . . Each of the plurality of groups G1 and G2 includes at least two second pixels (IR pixels). In general, each of the plurality of groups G1 and G2 is formed by the same number of second pixels (IR pixels).

The solid-state image sensor 1000 includes synthesizers SW each for synthesizing one signal from the signals of at least two second pixels (IR pixels) included in each group so as to output one signal for each group. In the example shown in FIG. 1, the synthesizer SW for the group G1 synthesizes one signal from the signals of the two second pixels (IR pixels) forming the group G1 so as to output one signal for the group G1. The synthesizer SW for the group G2 synthesizes one signal from the signals of the two second pixels (IR pixels) forming the group G2 so as to output one signal for the group G2.

At least two second pixels (IR pixels) forming each group can be arranged on the same row to sandwich a first pixel. In the example shown in FIG. 1, the two second pixels (IR pixels) forming the group G1 are arranged on the same row to sandwich the first pixel (B pixel). Similarly, the two second pixels (IR pixels) forming the group G2 are arranged on the same row to sandwich the first pixel (B pixel). The two second pixels (IR pixels) forming the group G1 and the two second pixels (IR pixels) forming the group G2 are arranged on the different rows.

Figure 4:
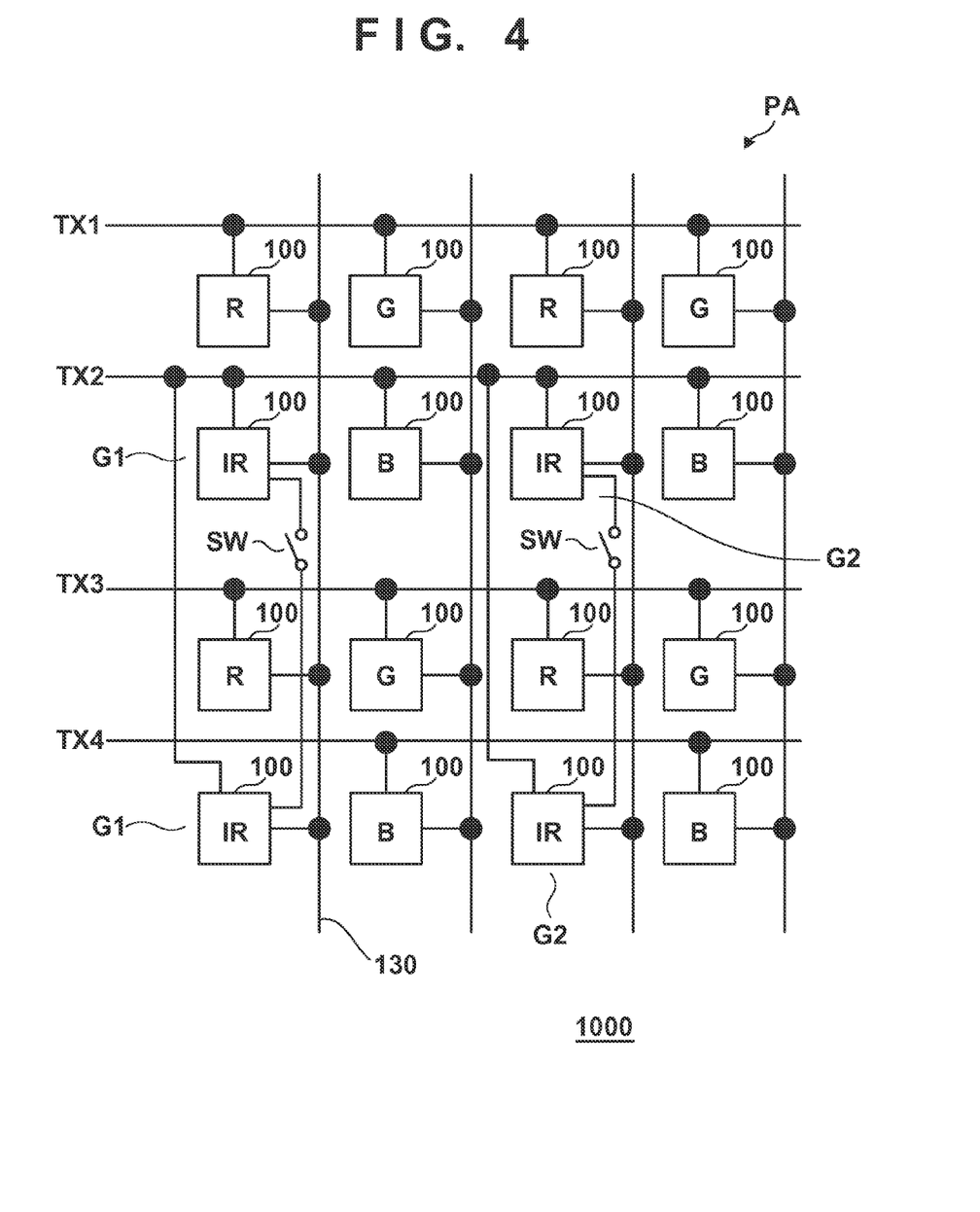
FIG. 4 is a view showing the arrangement of the pixel array of a solid-state image sensor according to the second embodiment of the present invention.

In an example shown in FIG. 4 (to be described later), two second pixels (IR pixels) forming a group G1 are arranged on the same column to sandwich a first pixel (R pixel). Similarly, two second pixels (IR pixels) forming a group G2 are arranged on the same column to sandwich a first pixel (R pixel).

Figure 2:
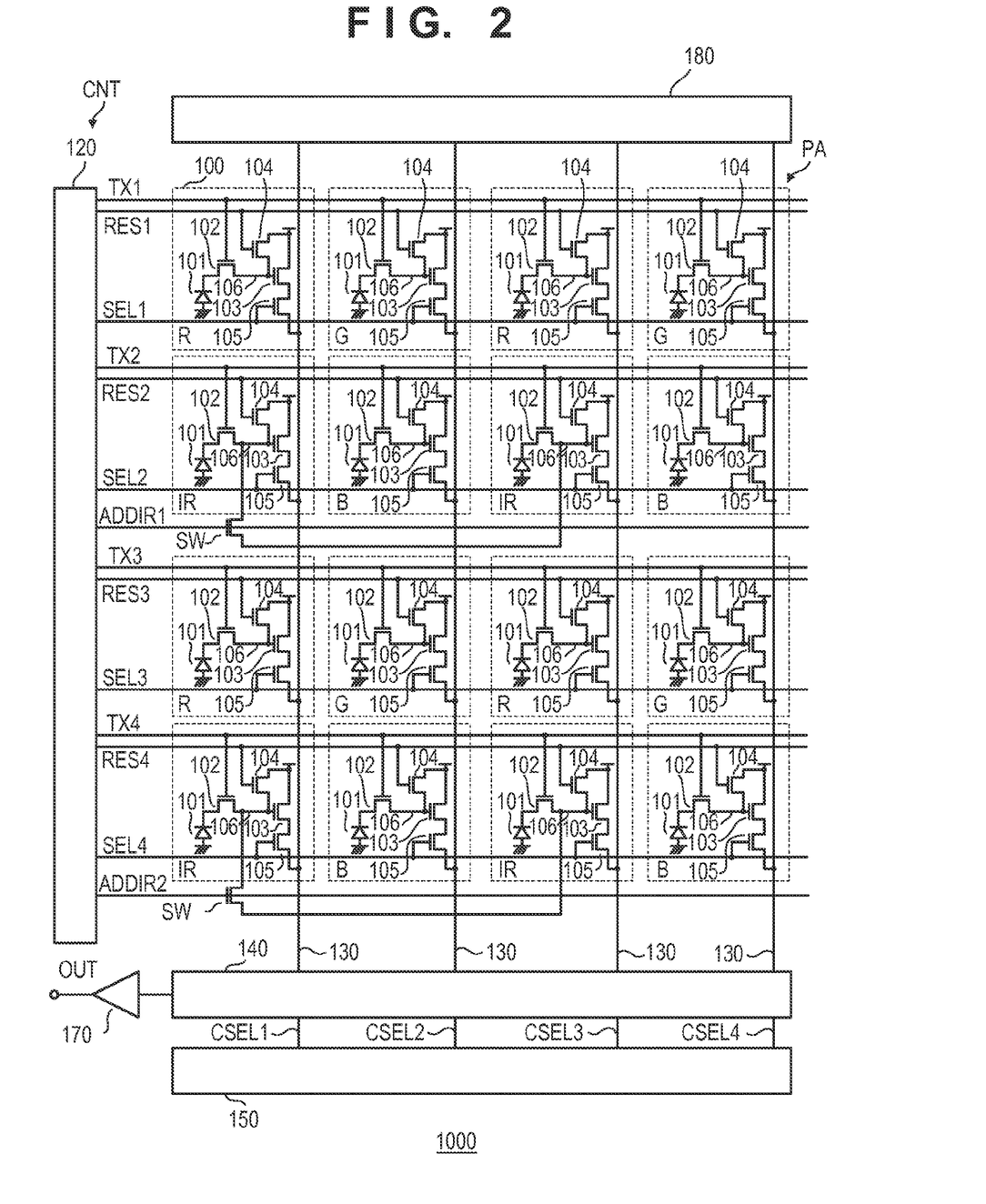
FIG. 2 is a circuit diagram showing the circuit arrangement of the solid-state image sensor according to the first embodiment of the present invention.

FIG. 2 shows the circuit arrangement of the solid-state image sensor 1000 according to the first embodiment of the present invention. The solid-state image sensor 1000 includes the pixel array PA, a vertical selecting circuit (vertical scanning circuit) 120, a readout circuit 140, a horizontal selecting circuit (horizontal scanning circuit) 150, an output unit 170, and a load transistor array 180. Each pixel 100 (R, G, B, or IR pixel) can include a photoelectric converter 101, a floating diffusion (FD) 106, a transfer transistor 102, an amplification transistor 103, and a reset transistor 104. Each pixel 100 may also include a selection transistor 105. The photoelectric converter 101 includes, for example, a photodiode, and photoelectrically converts incident light and accumulates charges generated by the photoelectric conversion. The transfer transistor 102 transfers the charges accumulated in the photoelectric converter 101 to the FD 106. The potential of the FD 106 changes depending on the amount of charges transferred to the FD 106. The amplification transistor 103 forms a source follower circuit together with a load transistor of the load transistor array 180, and outputs a signal corresponding to the potential of the FD 106 to a corresponding column signal line 130. The reset transistor 104 resets the potential of the FD 106. The selection transistor 105 can be arranged to set its pixel 100 in a selected state or unselected state.

The transfer transistor 102 is controlled by a corresponding transfer control line driven by the vertical selecting circuit 120. Reference symbols TX1, TX2, TX3, and TX4 denote transfer control lines. More specifically, the transfer control line TX1 is used for the R and G pixels on the first row. The transfer control line TX2 is used for the B and IR pixels on the second row. The transfer control line TX3 is used for the R and G pixels on the third row. The transfer control line TX4 is used for the B and IR pixels on the fourth row. The reset transistor 104 is controlled by a corresponding reset control line driven by the vertical selecting circuit 120. Reference symbol RES1 denotes a reset control line on the first row; RES2, a reset control line on the second row; RES3, a reset control line on the third row; and RES4, a reset control line on the fourth row. The selection transistor 105 is controlled by a corresponding row selecting line driven by the vertical selecting circuit 120. Reference symbol SEL1 denotes a row selecting line on the first column; SEL2, a row selecting line on the second column; SEL3, a row selecting line on the third column; and SEL4, a row selecting line on the fourth column.

The readout circuit 140 generates a pixel signal by processing a signal output to each column signal line 130, and outputs, to the output unit 170, the pixel signal on the column selected by the column selection line driven by the horizontal selecting circuit 150. The output unit 170 amplifies the pixel signal from the readout circuit 140, and outputs the amplified signal. Reference symbol CSEL1 denotes a column selecting line on the first column; CSEL2, a column selecting line on the second column; CSEL3, a column selecting line on the third column; and CSEL4, a column selecting line on the fourth column.

Each synthesizer SW synthesizes one signal from the signals of at least two second pixels (IR pixels) forming each group so as to output one signal for each group. In the example shown in FIG. 2, in each group on the second row, the synthesizer SW of the group synthesizes one signal from the signals of the two second pixels (IR pixels) forming the group. The synthesizers SW on the second row are controlled by a synthesizer control line ADDIR1 driven by the vertical selecting circuit 120. Similarly, in each group on the fourth row, the synthesizer SW of the group synthesizes one signal from the signals of the two second pixels (IR pixels) forming the group. The synthesizers SW on the fourth row are controlled by a synthesizer control line ADDIR2 driven by the vertical selecting circuit 120. More specifically, in a synthesizing mode in which the signals of the two second pixels (IR pixels) forming each group are synthesized, the vertical selecting circuit 120 drives the synthesizer control lines ADDIR1 and ADDIR2 to an active level, thereby allowing the synthesizers SW to synthesize the signals. Each synthesizer SW can include a switch (for example, a transistor) which is turned on according to a signal input via the synthesizer control line ADDIR1 or ADDIR2. Alternatively, in the specifications in which the sensor always operates in the synthesizing mode, each synthesizer SW may be formed by an electrically conductive member for electrically interconnecting the floating diffusions of the second pixels forming the group.

Figure 3:
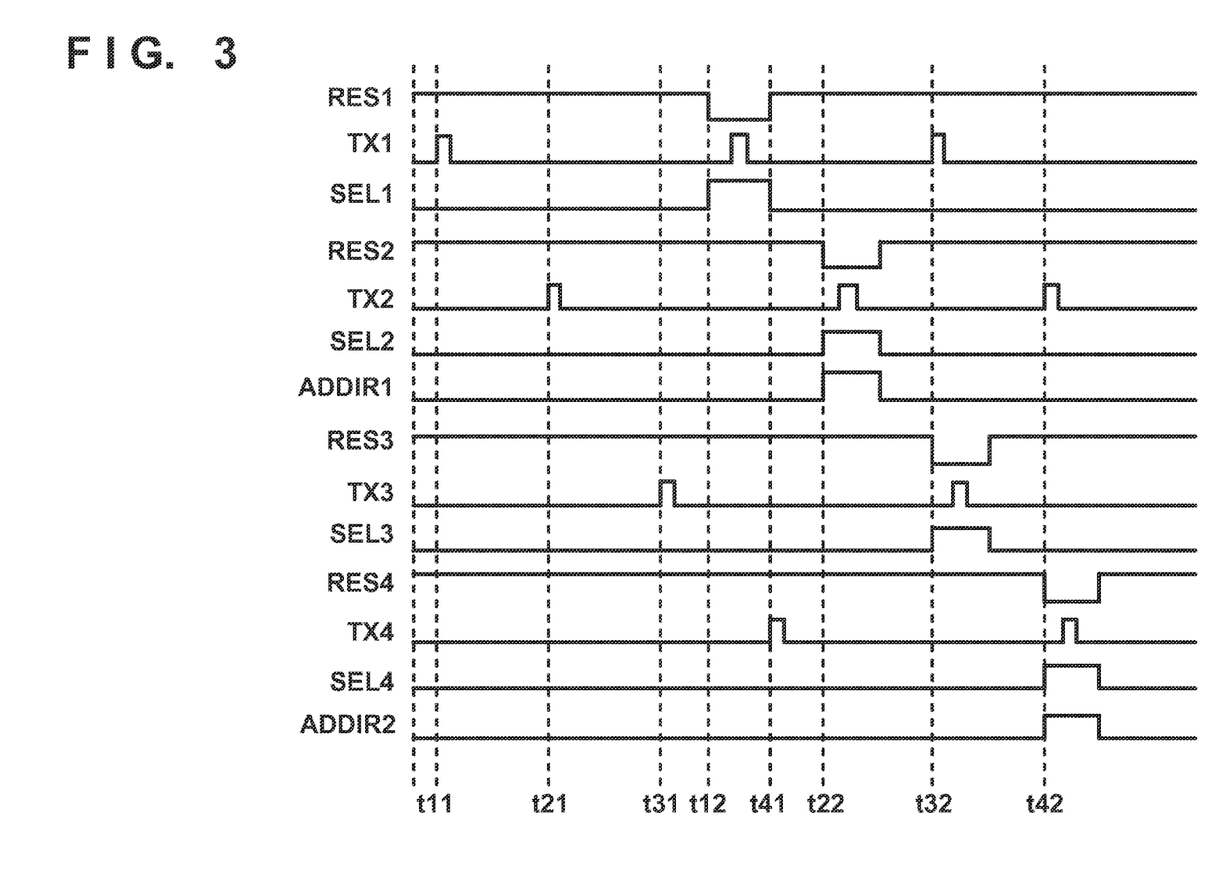
FIG. 3 is a timing chart exemplifying the operation of the solid-state image sensor in a synthesizing mode according to the first embodiment of the present invention.

The operation of the solid-state image sensor 1000 in the synthesizing mode according to the first embodiment will be described with reference to FIG. 3. An operation associated with the first row will be explained first. While the voltage level of the reset control line RES1 on the first row is at high level, a high pulse is applied to the transfer control line TX1 on the first row at time t11. This turns on the transfer transistors 102 of the first pixels (R and G pixels) on the first row, thereby resetting the FDs 106 and photoelectric converters 101 of the pixels. When the transfer transistors 102 of the pixels on the first row are turned off, the photoelectric converters 101 of the pixels on the first row start to accumulate charges. At time t12, the voltage level of the reset control line RES1 on the first row is set at low level and the voltage level of the row selecting line SEL1 on the first row is set at high level (active level), thereby turning on the selection transistors 105 of the pixels on the first row. In this state, a high pulse is applied to the transfer control line TX1 on the first row, the transfer transistors 102 of the pixels (first pixels (R and G pixels)) on the first row are turned on, and the photoelectric converters 101 transfer the charges to the corresponding FDs 106, respectively. This changes the potential of each FD 106. Each amplification transistor 103 outputs a signal corresponding to the potential of the FD 106 to the column signal line 130 via the selection transistor 105.

An operation associated with the second row will be described next. While the voltage level of the reset control line RES2 on the second row is at high level, a high pulse is applied to the transfer control line TX2 on the second row at time t21 after time t11. This turns on the transfer transistors 102 of the first pixels (B pixels) and the second pixels (IR pixels) on the second row, thereby resetting the FDs 106 and photoelectric converters 101 of the pixels. When the transfer transistors 102 of the pixels on the second row are turned off, the photoelectric converters 101 of the pixels on the second row start to accumulate charges. At time t22, the voltage level of the reset control line RES2 on the second row is set at low level and the voltage levels of the row selecting line SEL2 and synthesizer control line ADDIR1 on the second row are set at high level (active level). This turns on the selection transistors 105 of the pixels on the second row and the synthesizers SW on the second row. In this state, a high pulse is applied to the transfer control line TX2 on the second row, the transfer transistors 102 of the first pixels (B pixels) and second pixels (IR pixels) on the second row are turned on, and the photoelectric converters 101 transfer the charges to the corresponding FDs 106, respectively. This changes the potential of each FD 106. Each amplification transistor 103 outputs a signal corresponding to the potential of the FD 106 to the column signal line 130 via the selection transistor 105. Each synthesizer SW synthesizes one signal from the signals of the plurality of second pixels (IR pixels) included in one group. More specifically, the FDs 106 of at least two second pixels (IR pixels) forming a group are electrically interconnected by the synthesizer SW controlled by the synthesizer control line ADDIR1. That is, the FDs 106 form one node. Therefore, the charges transferred by each photoelectric converter 101 are mixed or added at the one node. In other words, the potentials of the at least two FDs 106 are averaged. This improves the S/N ratio (signal/noise ratio) of the second pixels (IR pixels). The reason why the S/N ratio improves will be described later. Note that in the above-described embodiment, charges transferred from the photoelectric converter 101 to the FD 106 correspond to the signal of each pixel, and a signal based on the average potential corresponds to a synthesized signal.

An operation associated with the third row will be described next. While the voltage level of the reset control line RES3 on the third row is at high level, a high pulse is applied to the transfer control line TX3 on the third row at time t31 after time t21. This turns on the transfer transistors 102 of the first pixels (R and G pixels) on the third row, thereby resetting the FDs 106 and photoelectric converters 101 of the pixels. When the transfer transistors 102 of the pixels on the third row are turned off, the photoelectric converters 101 of the pixels on the third row start to accumulate charges. At time t32, the voltage level of the reset control line RES3 on the third row is set at low level and the voltage level of the row selecting line SEL3 on the third row is set at high level (active level), thereby turning on the selection transistors 105 of the pixels on the third row. In this state, a high pulse is applied to the transfer control line TX3 on the third row, the transfer transistors 102 of the pixels (first pixels (R and G pixels)) on the third row are turned on, and the photoelectric converters 101 transfer the charges to the corresponding FDs 106, respectively. This changes the potential of each FD 106. Each amplification transistor 103 outputs a signal corresponding to the potential of the FD 106 to the column signal line 130 via the selection transistor 105.

An operation associated with the fourth row will be described next. While the voltage level of the reset control line RES4 on the fourth row is at high level, a high pulse is applied to the transfer control line TX4 on the fourth row at time t41 after time t31. This turns on the transfer transistors 102 of the first pixels (B pixels) and second pixels (IR pixels) on the fourth row, thereby resetting the FDs 106 and photoelectric converters 101 of the pixels. When the transfer transistors 102 of the pixels on the fourth row are turned off, the photoelectric converters 101 of the pixels on the fourth row start to accumulate charges. At time t42, the voltage level of the reset control line RES4 on the fourth row is set at low level and the voltage levels of the row selecting line SEL4 and synthesizer control line ADDIR2 on the fourth row are set at high level (active level). This turns on the selection transistors 105 of the pixels on the fourth row and the synthesizers SW on the fourth row. In this state, a high pulse is applied to the transfer control line TX4 on the fourth row, the transfer transistors 102 of the first pixels (B pixels) and second pixels (IR pixels) on the fourth row are turned on, and the photoelectric converters 101 transfer the charges to the corresponding FDs 106, respectively. This changes the potential of each FD 106. Each amplification transistor 103 outputs a signal corresponding to the potential of the FD 106 to the column signal line 130 via the selection transistor 105. Each synthesizer SW synthesizes one signal from the signals of the second pixels (IR pixels) forming a group. More specifically, the FDs 106 of at least two second pixels (IR pixels) forming a group are electrically interconnected by the synthesizer SW controlled by the synthesizer control line ADDIR2. The potentials of the at least two FDs 106 are averaged. This improves the S/N ratio (signal/noise ratio) of the second pixels (IR pixels).

Improvement in S/N ratio will be explained below. As an example, assume that each group is formed by two second pixels (IR pixels). Let S be a signal (charge amount) without noise and $\sigma$ be noise (charge amount). The noise $\sigma$ is random noise generated in a pixel, and can include, for example, optical shot noise and dark electronic noise generated in the photoelectric converter 101 and transfer transistor 102.

Let $\sigma'$ be noise after synthesizing one signal from the signals of the two second pixels. Then, $\sigma'^2=\sigma^2+\sigma^2=2\sigma^2$, that is, $\sigma'=(\sqrt{2})\times\sigma$. On the other hand, a signal obtained by synthesizing the signals S of the two second pixels is represented by $2\times S$. Note that $\sigma^2$ represents the square of $\sigma$ and $\sigma'^2$ represents the square of $\sigma'$.

An S/N ratio when the signals of the two second pixels are synthesized is $2S/((\sqrt{2})\times\sigma)=(\sqrt{2})S/\sigma$. That is, the S/N ratio when the signals of the two second pixels are synthesized is $\sqrt{2}$ times an S/N ratio when the signals are not synthesized.

In the above example, the solid-state image sensor 1000 outputs an image signal including the signals of the first pixels and those of the second pixels. However, the solid-state image sensor 1000 may separately output a frame formed by the signals of the first pixels and that formed by the signals of the second pixels. The frame formed by the signals of the first pixels and that formed by the signals of the second pixels can be alternately displayed.

In the above example, the number of signals of the second pixels (IR pixels) is smaller than that of signals of the first pixels (R, G, and B pixels). It is, however, possible to improve the resolution of an infrared light image formed by the signals of the second pixels by using the signals of the first pixels (for example, luminance information of the G pixels).

A solid-state image sensor 1000 according to the second embodiment of the present invention will be described with reference to FIG. 4. Note that details not mentioned in the second embodiment can conform to the first embodiment. In the second embodiment, each group is formed by at least two second pixels on the same column, and each synthesizer SW synthesizes one signal from the signals of the second pixels of each group. In the example shown in FIG. 4, two second pixels (IR pixels) forming a group G1 are arranged on the same column to sandwich a first pixel (R pixel). Similarly, two second pixels (IR pixels) forming a group G2 are arranged on the same column to sandwich a first pixel (R pixel).

Each of the second and fourth rows of a pixel array PA includes B pixels as first pixels and IR pixels as second pixels. When outputting the signal of each IR pixel on the second row, the sensor outputs a signal obtained by synthesizing the signal of the IR pixel on the second row and that of the IR pixel on the fourth row by the synthesizer SW. Each synthesizer SW can be configured to electrically connect an FD 106 of the IR pixel on the second row and that of the IR pixel on the fourth row.

Figure 5:
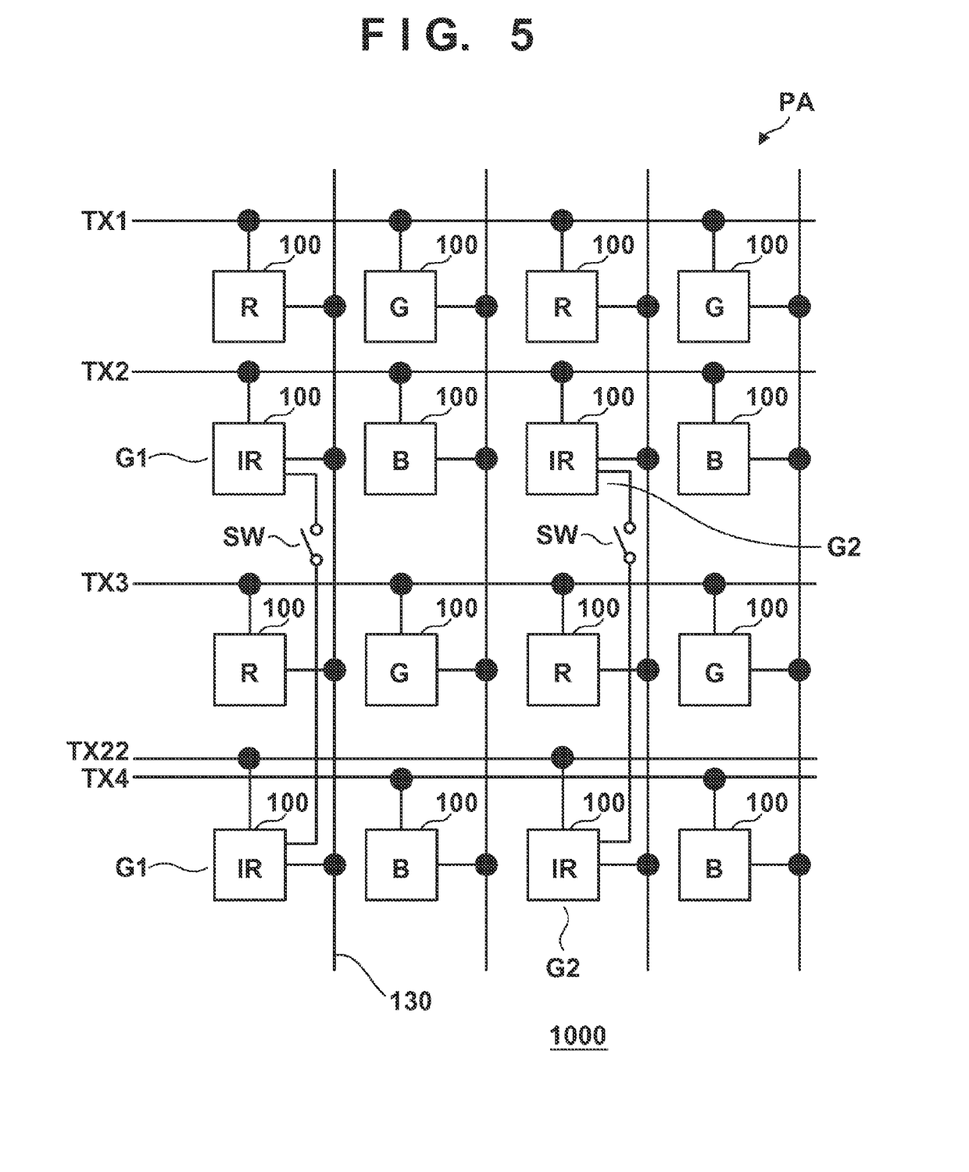
FIG. 5 is a view showing the arrangement of the pixel array of a solid-state image sensor according to the third embodiment of the present invention.

A solid-state image sensor 1000 according to the third embodiment of the present invention will be described with reference to FIG. 5. Note that details not mentioned in the third embodiment can conform to the first embodiment. Similarly to the second embodiment, in the third embodiment, each group is formed by at least two second pixels on the same column, and each synthesizer SW synthesizes the signals of the second pixels of each group. In the example shown in FIG. 5, two second pixels (IR pixels) forming a group G1 are arranged on the same column to sandwich a first pixel (R pixel). Similarly, two second pixels (IR pixels) forming a group G2 are arranged on the same column to sandwich a first pixel (R pixel).

In the third embodiment, a transfer control line TX2 on the second row is connected to transfer transistors 102 of the B pixels as the first pixels and those of the IR pixels as the second pixels. A transfer control line TX4 on the fourth row is connected to only transfer transistors 102 of the B pixels as the first pixels. A dedicated transfer control line TX22 is connected to transfer transistors 102 of the IR pixels on the fourth row. The same signal is supplied to the transfer control lines TX2 and TX22. In the B pixels as the first pixels and the IR pixels as the second pixels on the second row, and the IR pixels as the second pixels on the fourth row, photoelectric converters transfer charges to corresponding FDs at the same time.

Figure 6:
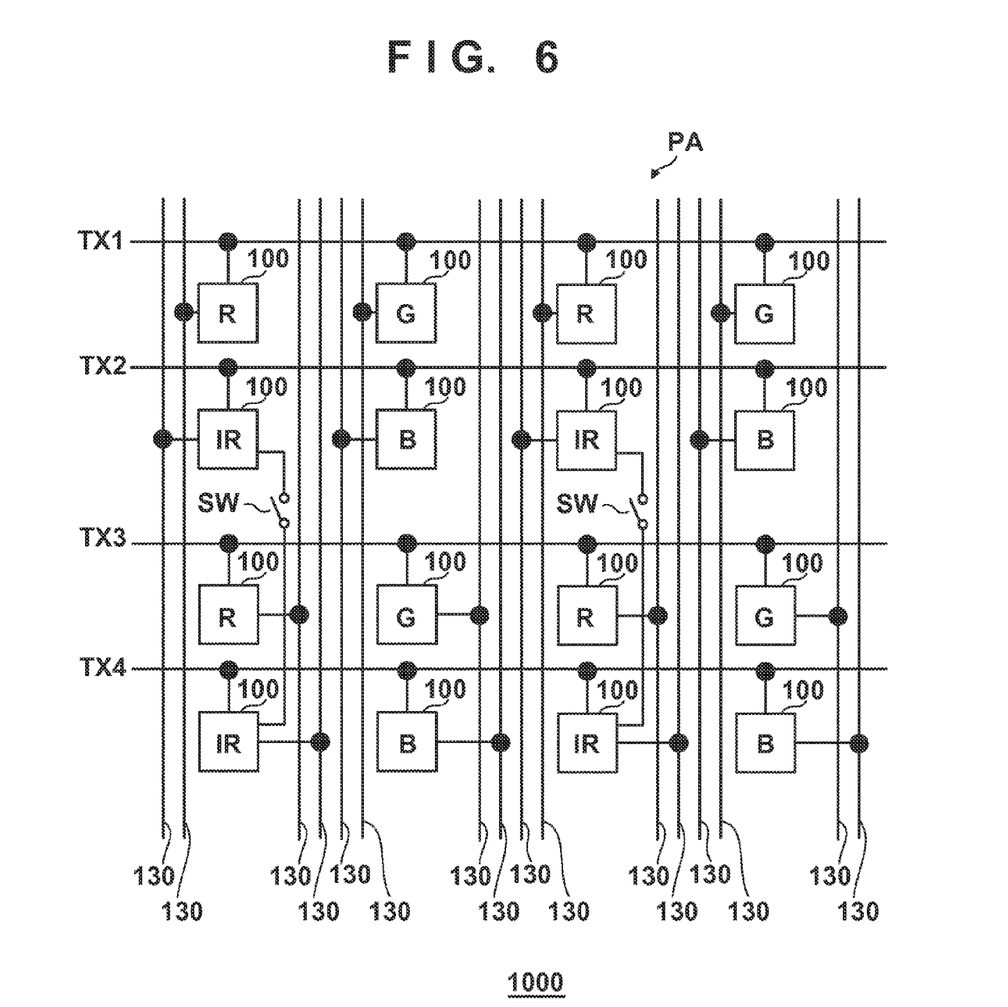
FIG. 6 is a view showing the arrangement of the pixel array of a solid-state image sensor according to the fourth embodiment of the present invention.

A solid-state image sensor 1000 according to the fourth embodiment of the present invention will be described with reference to FIG. 6. Note that details not mentioned in the fourth embodiment can conform to the first embodiment. Similarly to the second embodiment, in the fourth embodiment, each group is formed by at least two second pixels on the same column, and each synthesizer SW synthesizes one signal from the signals of the second pixels of each group. In the example shown in FIG. 6, two second pixels (IR pixels) forming a group G1 are arranged on the same column to sandwich a first pixel (R pixel). Similarly, two second pixels (IR pixels) forming a group G2 are arranged on the same column to sandwich a first pixel (R pixel).

In the fourth embodiment, four column signal lines 130 are assigned to one column. It is possible to simultaneously output the signals of the pixels on the four rows by driving transfer control lines TX1 to TX4 on the first to fourth rows to an active level at the same time.

Figure 7:
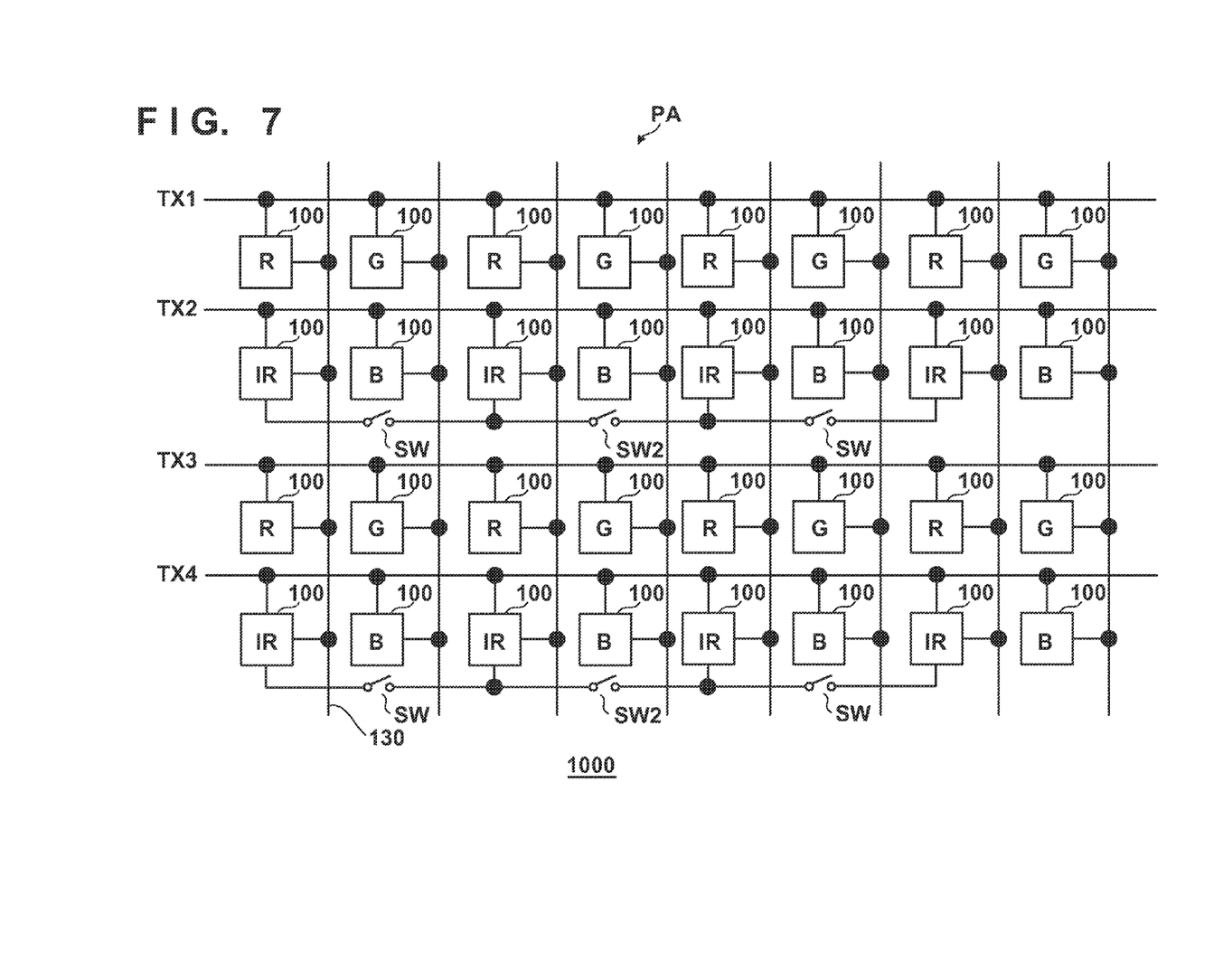
FIG. 7 is a view showing the arrangement of the pixel array of a solid-state image sensor according to the fifth embodiment of the present invention.

A solid-state image sensor 1000 according to the fifth embodiment of the present invention will be described with reference to FIG. 7. Note that details not mentioned in the fifth embodiment can conform to the first embodiment. The solid-state image sensor 1000 of the fifth embodiment includes changing units SW2 each for changing the number of second pixels whose signals are synthesized, that is, the number of second pixels forming each group. In the example shown in FIG. 7, if the changing units SW2 are in an inactive state, each group is formed by two second pixels. Alternatively, if the changing units SW2 are in an active state, each group is formed by four second pixels.

Figure 9:
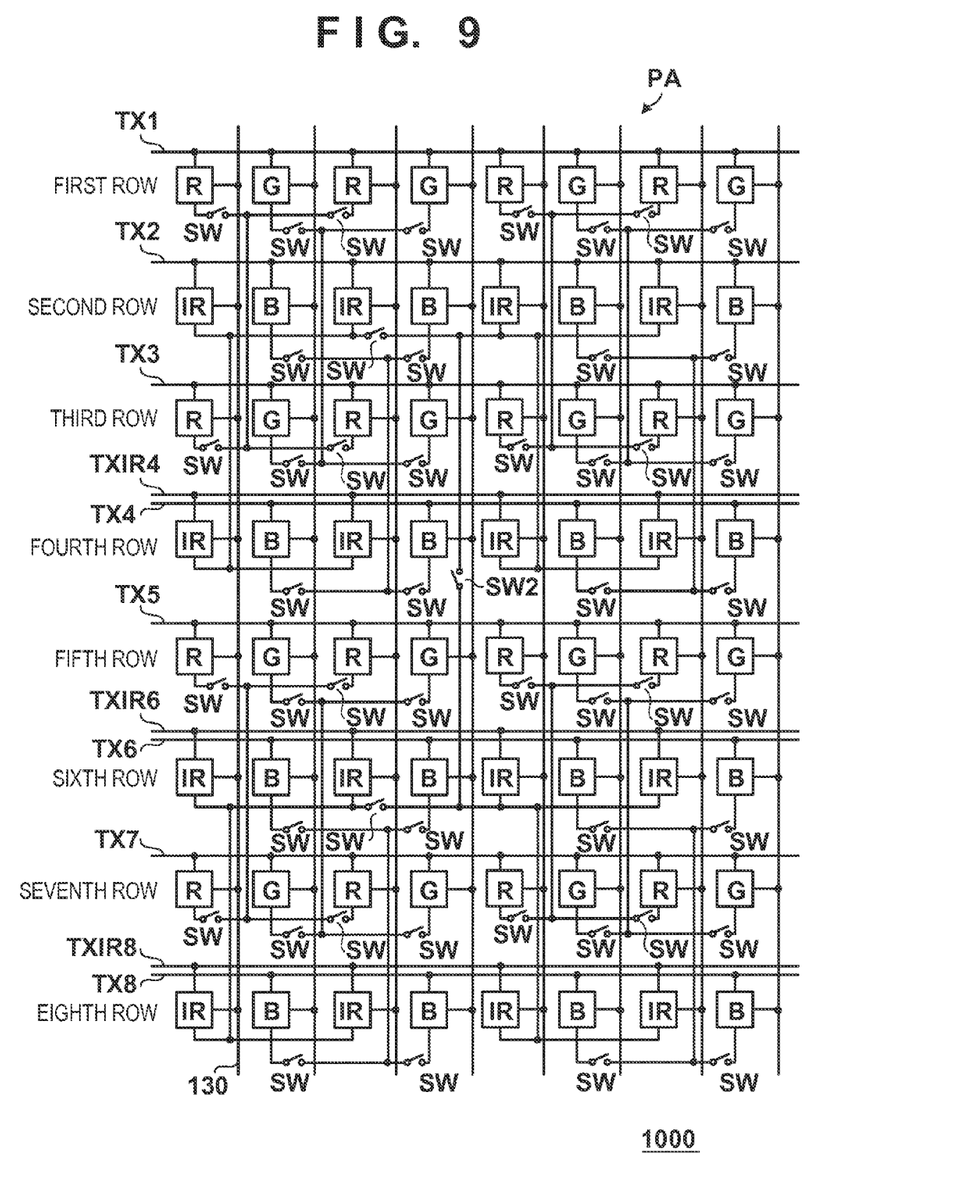
FIG. 9 is a view showing the arrangement of the pixel array of a solid-state image sensor according to the sixth embodiment of the present invention.

A solid-state image sensor 1000 according to the sixth embodiment of the present invention will be described with reference to FIG. 9. Note that details not mentioned in the sixth embodiment can conform to the first embodiment. Each of R, G, B, and IR pixels to be described below can have the same arrangement as that of the pixel 100 shown in FIG. 2.

The solid-state image sensor 1000 of the sixth embodiment has a function of synthesizing one signal from the signals of a plurality of pixels (in this example, 2×2=4 pixels) for R, G, or B pixels. A synthesizer SW arranged between R pixels is configured to connect FDs 106 of the plurality of R pixels. A synthesizer SW arranged between G pixels is configured to connect FDs 106 of the plurality of G pixels. A synthesizer SW arranged between B pixels is configured to connect FDs 106 of the plurality of B pixels. When the synthesizers SW are turned on (activated), the signals of the plurality of R pixels are synthesized, the signals of the plurality of G pixels are synthesized, and the signals of the plurality of B pixels are synthesized.

In the solid-state image sensor 1000 of the sixth embodiment, FDs 106 of a first number of IR pixels are permanently connected to each other, thereby synthesizing one signal from the signals of the first number of IR pixels. When the synthesizers SW are turned on (activated), FDs 106 of a second number of IR pixels, which is larger than the first number, are connected to each other, thereby synthesizing one signal from the signals of the second number of IR pixels.

The solid-state image sensor 1000 of the sixth embodiment can have a first mode and a second mode. The first mode is implemented when the synthesizers SW are turned off (inactivated). In the first mode, the signals of the R pixels, those of the G pixels, and those of B pixels are output without being synthesized, and the signals of the first number of IR pixels among the signals of the IR pixels are synthesized and output. The second mode is implemented when the synthesizers SW are turned on (activated). In the second mode, the signals of the plurality of R pixels are synthesized and output, the signals of the plurality of G pixels are synthesized and output, and the signals of the plurality of B pixels are synthesized and output. Furthermore, in the second mode, the signals of the second number of IR pixels are synthesized and output. The second mode is a mode in which the number of pixels whose signals are synthesized is larger than that in the first mode.

An operation in the first mode will be exemplarily described. Transfer transistors 102 of the R and G pixels on the first row are connected to a transfer control line TX1. When the transfer control line TX1 is driven to an active level, the signals of the R and G pixels on the first row are output to corresponding column signal lines 130.

Transfer transistors 102 of the IR and B pixels on the second row are connected to a transfer control line TX2. Transfer transistors 102 of the IR pixels on the fourth row are connected to a transfer control line TXIR4. The transfer control lines TX2 and TXIR4 are simultaneously driven to an active level. With this operation, the signals of the B pixels on the second row are output to the corresponding column signal lines 130 and, at the same time, a signal obtained by synthesizing the signals of the first number of IR pixels including the two IR pixels on the second row and the two IR pixels on the fourth row is output to another column signal line 130.

Transfer transistors 102 of the R and G pixels on the third row are connected to a transfer control line TX3. When the transfer control line TX3 is driven to an active level, the signals of the R and G pixels on the third row are output to the corresponding column signal lines 130.

Transfer transistors 102 of the B pixels on the fourth row are connected to a transfer control line TX4. When the transfer control line TX4 is driven to an active level, the signals of the B pixels on the fourth row are output to the corresponding column signal lines 130. At this time, a signal obtained by synthesizing the signals of the IR pixels on the second and fourth rows is output to another column signal line 130. This signal is the same as that output when the signals on the first row are output.

Transfer transistors 102 of the R and G pixels on the fifth row are connected to a transfer control line TX5. When the transfer control line TX5 is driven to an active level, the signals of the R and G pixels on the fifth row are respectively output to the corresponding column signal lines 130.

Transfer transistors 102 of the B pixels on the sixth row are connected to a transfer control line TX6 and transfer transistors 102 of the IR pixels on the sixth row are connected to a transfer control line TXIR6. Transfer transistors 102 of the IR pixels on the eighth row are connected to a transfer control line TXIR8. The transfer control lines TX6, TXIR6, and TXIR8 are simultaneously driven to an active level. With this operation, the signals of the B pixels on the sixth row are output to the corresponding column signal lines 130 and, at the same time, a signal obtained by synthesizing the signals of the first number of IR pixels including the two IR pixels on the sixth row and the two IR pixels on the eighth row is output to another column signal line 130.

Transfer transistors 102 of the R and G pixels on the seventh row are connected to a transfer control line TX7. When the transfer control line TX7 is driven to an active level, the signals of the R and G pixels on the seventh row are output to the corresponding column signal lines 130.

Transfer transistors 102 of the B pixels on the eighth row are connected to a transfer control line TX8. When the transfer control line TX8 is driven to an active level, the signals of the B pixels on the eighth row are output to the corresponding column signal lines 130. At this time, a signal obtained by synthesizing the signals of the IR pixels on the sixth and eighth rows is output to another column signal line 130. This signal is the same as that output when the signals on the sixth row are output.

An operation in the second mode will be exemplarily described below. In the second mode, all the synthesizers SW are turned on. With this operation, in this example, the FDs 106 of the four R pixels are interconnected, the FDs 106 of the four G pixels are interconnected, and the FDs 106 of the four B pixels are interconnected. Furthermore, the FDs 106 of the 16 IR pixels are interconnected.

The transfer control line TX1 on the first row and the transfer control line TX3 on the third row are simultaneously driven to an active level. With this operation, a signal obtained by synthesizing the signals of the two R pixels on the first row and those of the two R pixels on the third row and a signal obtained by synthesizing the signals of the two G pixels on the first row and those of the two G pixels on the third row are output to the corresponding column signal lines 130.

Subsequently, the transfer control line TX2 on the second row, the transfer control lines TX4 and TXIR4 on the fourth row, the transfer control line TXIR6 on the sixth row, and the transfer control line TXIR8 on the eighth row are simultaneously driven to an active level. With this operation, a signal obtained by synthesizing the signals of the two B pixels on the second row and those of the two B pixels on the fourth row is output to the column signal line 130. Furthermore, a signal obtained by synthesizing the signals of the four IR pixels on the second row, those of the four IR pixels on the fourth row, those of the four IR pixels on the sixth row, and those of the four IR pixels on the eighth row is output to another column signal line 130. The signals of pixels on the following rows are output using the same method.

In the sixth embodiment, the FDs 106 are used to synthesize one signal from the signals of pixels on a plurality of rows and synthesize the signals of pixels on a plurality of columns. However, this is merely an example. The signals of pixels on a plurality of rows may be synthesized using the FDs 106, and the signals of pixels on a plurality of columns may be synthesized by a readout circuit 140.

Figure 8:
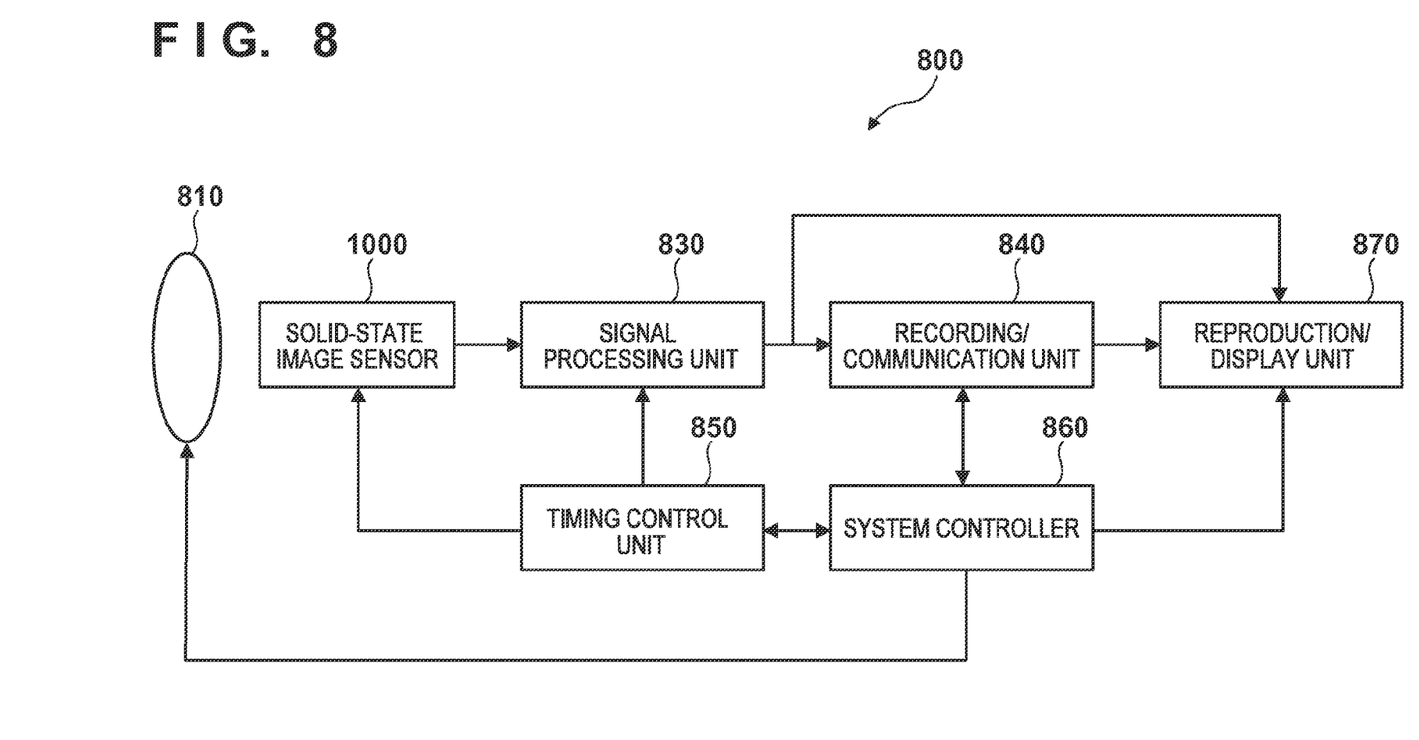
FIG. 8 is a block diagram showing the arrangement of a camera according to one embodiment of the present invention.

A camera 800 according to one embodiment of the present invention will be described below with reference to FIG. 8. The concept of the camera includes not only an apparatus whose main purpose is imaging, but also an apparatus (for example, a personal computer or portable terminal) having an imaging function as an auxiliary function. The camera includes the solid-state image sensor according to the present invention exemplified as the above-mentioned embodiments, and a processing unit that processes a signal (image) output from the solid-state image sensor. This processing unit can include an A/D converter, and a processor that processes digital data output from the A/D converter.

The camera 800 includes, for example, an optical system 810, the solid-state image sensor 1000, a signal processing unit 830, a recording/communication unit 840, a timing control unit 850, a system controller 860, and a reproduction/display unit 870. The optical system 810 forms an image of an object on the pixel array of the solid-state image sensor 1000. The solid-state image sensor 1000 outputs an image by performing imaging operation based on a signal from the timing control unit 850. The image output from the solid-state image sensor 1000 is provided to the signal processing unit 830.

The signal processing unit 830 processes a visible light image and infrared light image provided by the solid-state image sensor 1000 and provides the resultant data to the recording/communication unit 840. If the resolution of the infrared light image is insufficient, the signal processing unit 830 can improve the resolution of the infrared light image using the visible light image.

The recording/communication unit 840 sends an image to the reproduction/display unit 870 to cause it to reproduce and display the image. The recording/communication unit 840 also records the image in a recording medium (not shown).

The timing control unit 850 controls the driving timings of the solid-state image sensor 1000 and signal processing unit 830 under the control of the system controller 860. The system controller 860 comprehensively controls the operation of the camera 800, and controls driving of the optical system 810, the timing control unit 850, the recording/communication unit 840, and the reproduction/display unit 870. The system controller 860 includes, for example, a storage device (not shown), and records programs required to control the operation of an imaging system and the like in the storage device. In addition, the system controller 860 sets a mode in accordance with, for example, an operation by the user.

The settable modes can include a mode in which a visible light image and an infrared light image are synthesized, and displayed by the reproduction/display unit. The selectable modes can also include a mode in which the reproduction/display unit individually displays a visible light image and an infrared light image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-100707, filed May 10, 2013, and No. 2014-066811, filed Mar. 27, 2014, which are hereby incorporated by reference herein in their entirety.

What is claimed is:

1. A solid-state image sensor including a plurality of first pixels and a plurality of second pixels, wherein
   each of the plurality of first pixels includes a first filter having a visible light transmittance higher than an infrared light transmittance and a first photoelectric converter configured to receive visible light transmitted through the first filter,
   each of the plurality of second pixels includes a second filter having an infrared light transmittance higher than a visible light transmittance, a second photoelectric converter configured to receive infrared light transmitted through the second filter, a floating diffusion region separated from the second photoelectric converter, and a transfer transistor configured to transfer charges generated by the second photoelectric converter to the floating diffusion region,
   the plurality of second pixels are divided into a plurality of groups each including at least two second pixels, and
   the solid-state image sensor includes a synthesizer configured to synthesize a signal from signals of the at least two second pixels included in each group, the synthesizer including a switch, for each group, configured to interconnect the floating diffusion regions of the at least two second pixels of each group, in accordance with a control signal input to the switch.

2. The sensor according to claim 1, wherein the at least two second pixels forming each group are arranged on the same row to sandwich a first pixel.

3. The sensor according to claim 1, wherein the at least two second pixels forming each group are arranged on the same column to sandwich a first pixel.

4. The sensor according to claim 1, further comprising a changer configured to change the number of at least two second pixels forming each group.

5. The sensor according to claim 1, wherein a row on which the first pixel and the second pixel are alternately arranged and a row on which only the first pixels are arranged are constituted.

6. The sensor according to claim 1, wherein the second filter blocks visible light and transmits infrared light.

7. A camera comprising:
   a solid-state image sensor including a plurality of first pixels and a plurality of second pixels; and
   a processor configured to process a signal output from the solid-state image sensor, wherein
   each of the plurality of first pixels includes a first filter having a visible light transmittance higher than an infrared light transmittance and a first photoelectric converter configured to receive visible light transmitted through the first filter,
   each of the plurality of second pixels includes a second filter having an infrared light transmittance higher than a visible light transmittance, a second photoelectric converter configured to receive infrared light transmitted through the second filter, a floating diffusion region separated from the second photoelectric converter, and a transfer transistor configured to transfer charges generated by the second photoelectric converter to the floating diffusion region,
   the plurality of second pixels are divided into a plurality of groups each including at least two second pixels, and
   the solid-state image sensor includes a synthesizer configured to synthesize a signal from signals of the at least two second pixels included in each group, the synthesizer including a switch, for each group, configured to interconnect the floating diffusion regions of the at least two second pixels of each group, in accordance with a control signal input to the switch.

8. The sensor according to claim 1, wherein, in each group, the charges generated by the second photoelectric converters are transferred by the transfer transistors to the floating diffusion regions and synthesized through the switch that interconnects the floating diffusion regions.

9. The sensor according to claim 1, wherein each of the plurality of first pixels further includes a first floating diffusion region and a first transfer transistor configured to transfer charges generated by the first photoelectric converter to the first floating diffusion region, and
   wherein the plurality of first pixels include a first pixel the first floating diffusion region of which is not connected to the first floating diffusion region of another first pixel.

10. A solid-state image sensor including a plurality of first pixels and a plurality of second pixels, wherein
   each of the plurality of first pixels includes a first filter having a visible light transmittance higher than an infrared light transmittance and a first photoelectric converter configured to receive visible light transmitted through the first filter,
   each of the plurality of second pixels includes a second filter having an infrared light transmittance higher than a visible light transmittance, a second photoelectric converter configured to receive infrared light transmitted through the second filter, a floating diffusion region separated from the second photoelectric converter, and a transfer transistor configured to transfer charges generated by the second photoelectric converter to the floating diffusion region, the plurality of second pixels are divided into a plurality of groups each including at least two second pixels, and
the solid-state image sensor includes a switch, for each group, configured to interconnect the floating diffusion regions of the at least two second pixels of each group, in accordance with a control signal input to the switch.

11. The sensor according to claim 10, wherein, in each group, the charges generated by the second photoelectric converters are transferred by the transfer transistors to the floating diffusion regions and synthesized through the switch that interconnects the floating diffusion regions.

12. The sensor according to claim 1, wherein each of the plurality of first pixels further includes a floating diffusion region and a transfer transistor,
the plurality of first pixels and the plurality of second pixels are arranged in a row includes first pixels of the plurality of first pixels and second pixels of the plurality of second pixels, and
a first transfer control line is connected to the transfer transistor of the first pixels of the row, and a second transfer line is connected to the transfer transistor of the second pixels of the row.

13. The camera according to claim 7, wherein each of the plurality of first pixels further includes a floating diffusion region and a transfer transistor,
the plurality of first pixels and the plurality of second pixels are arranged so that a row includes first pixels of the plurality of first pixels and second pixels of the plurality of second pixels, and
a first transfer control line is connected to the transfer transistor of the first pixels of the row, and a second transfer line is connected to the transfer transistor of the second pixels of the row.

14. The sensor according to claim 10, wherein each of the plurality of first pixels further includes a floating diffusion region and a transfer transistor,
the plurality of first pixels and the plurality of second pixels are arranged so that a row includes first pixels of the plurality of first pixels and second pixels of the plurality of second pixels, and
a first transfer control line is connected to the transfer transistor of the first pixels of the row, and a second transfer line is connected to the transfer transistor of the second pixels of the row.

* * * * *